United States Patent [19]

Forgerson, II et al.

[11] Patent Number: 5,254,483

[45] Date of Patent: Oct. 19, 1993

[54] GATE-TO-OHMIC METAL CONTACT SCHEME FOR III-V DEVICES

[75] Inventors: C. David Forgerson, II; David A. Johnson, both of Camarillo, Calif.

[73] Assignee: Vitesse Semiconductor Corporation, Camarillo, Calif.

[21] Appl. No.: 846,225

[22] Filed: Mar. 4, 1992

Related U.S. Application Data

[60] Division of Ser. No. 618,992, Nov. 28, 1990, Pat. No. 5,121,174, which is a continuation-in-part of Ser. No. 402,802, Sep. 5, 1989, abandoned, which is a continuation-in-part of Ser. No. 112,232, Oct. 23, 1987, abandoned.

[51] Int. Cl.⁵ .......................................... H01L 21/265
[52] U.S. Cl. ........................................ 437/22; 437/45; 437/182
[58] Field of Search ................................. 437/40-45, 437/182, 22

[56] References Cited

U.S. PATENT DOCUMENTS

| | | | |
|---|---|---|---|
| 4,628,338 | 12/1986 | Nakayama et al. | 357/71 |
| 4,731,340 | 3/1988 | Chang et al. | 437/31 |
| 4,804,636 | 2/1989 | Groover, III et al. | 437/192 |
| 4,902,635 | 2/1990 | Imamura et al. | 437/44 |
| 4,978,637 | 12/1990 | Liou et al. | 437/192 |
| 5,063,174 | 11/1991 | Beyea et al. | 437/184 |

FOREIGN PATENT DOCUMENTS

59-18676  1/1984  Japan ................................ 357/23.1

Primary Examiner—Olik Chaudhuri
Assistant Examiner—Long Pham
Attorney, Agent, or Firm—Benman and Collins

[57] ABSTRACT

A direct shorting contact structure comprising a metal layer (18') makes ohmic contact with a source (10) and-/or drain (12) region and with a gate electrode (22). The direct contact between source or drain and gate over the active region (16) reduces the area otherwise required for such contact and eliminates a second layer (24) of interconnection metallization otherwise required for such contact. The metal layer preferably comprises a first layer (18'a) of a material selected from the group consisting of gold-germanium, nickel-germanium, gold-germanium-nickel, molybdenum-germanium, and aluminum-germanium in ohmic contact with the source or drain region and with the gate electrode and a second layer (18'b) of a good electrically conductive, thermally stable, electromigration-resistant metal capable of providing good step coverage overlying the first layer. An example of the second layer is tungsten and its nitrides and silicides. Such a composite layer avoids step coverage and reliability problems which exist with other metallization schemes.

14 Claims, 3 Drawing Sheets

GATE-TO-OHMIC METAL CONTACT SCHEME FOR III-V DEVICES

This is a division of application Ser. No. 07/618,992, filed Nov. 28, 1990 now, U.S. Pat. No. 5,121,1 which is a continuation-in-part application of Ser. No. 07/402,802, filed Sep. 5, 1989, which in turn is a continuation-in-part application of Ser. No. 07/112,232, filed Oct. 23, 1987, both now abandoned.

TECHNICAL FIELD

The present invention relates to III-V devices, such as GaAs devices, and, more particularly, to an improved gate-to-drain (and/or to source) connection scheme for such devices.

BACKGROUND ART

In many device applications, it is desired to short the source (or drain, or both) of a FET (field effect transistor) to the gate. The conventional method of making a gate-to-source contact requires contact holes to be opened in the first dielectric layer and the actual metal connection to be made between the source (or drain) and the gate with another layer of interconnection metal. Such a metal connection is routed around the active region of the device.

Nakayama et al in U.S. Pat. No. 4,628,338 disclose a semiconductor device in which a gate metal is contacted with an ohmic contact to a source or drain region. However, the contact is not direct, but rather is made through an extension of the gate electrode, thereby requiring undue space. Additionally, the metallization Nakayama specifies is not easily adapted to dense, high yielding circuits. More specifically, the minimum thickness of ohmic contact metal necessary to achieve a consistent contact is not compatible with the lift-off patterning technique necessary to define the metal.

Sugimoto Japanese patent 59-18676 discloses a direct shorting contact device which uses minimal space, and exhibits high yielding characteristics in dense circuits. This contact is built with silicon wafer processing, and the materials and processing steps used are incompatible with GaAs devices. No combination of the materials or structures in Nakayama and Sugimoto's disclosures may be used for high yielding, densely packed circuits on III-V semiconductors, so a different metallization scheme must be found to achieve this direct shorting contact.

DISCLOSURE OF INVENTION

In accordance with the invention, higher density of devices on a wafer is achieved by contacting the gate electrode directly with the source (or drain) metal. By direct contact is meant that the contact of the invention does not avoid the active region of the device, but rather is routed directly from the source (or drain) to the gate electrode over the active region.

A direct shorting contact structure comprising a contact metal layer is provided, which makes ohmic contact with a source or drain region and with a gate electrode. The direct contact between source or drain and gate reduces the area otherwise required for such contact and eliminates a second layer of metallization otherwise required for such contact.

The contact metal layer comprises a first layer of a well-known III-V contact material, such as gold-germanium, nickel germanium, gold-germanium nickel, molybdenum-germanium, or aluminum-germanium, in contact with the source or drain region and with the gate electrode and a second layer of an electrically conductive, thermally stable, electromigration-resistant metal overlying the first layer. The second layer must also provide good step coverage. By "good" step coverage is meant that at least 50% (or 250Å, whichever is smaller) of the metal covering the surface of the first layer also covers the sidewall of the first layer.

Such a composite layer avoids electrical continuity problems which exist with poor step coverage of other metallization schemes, while maintaining ease of patterning by the well-known lift-off techniques.

BEST MODES CARRYING OUT THE INVENTION

Device Considerations

The discussion which follows is presented in terms of gallium arsenide devices. However, it will be appreciated that the teachings of the invention are equally applicable to all III-V semiconductor devices.

Figure 1:
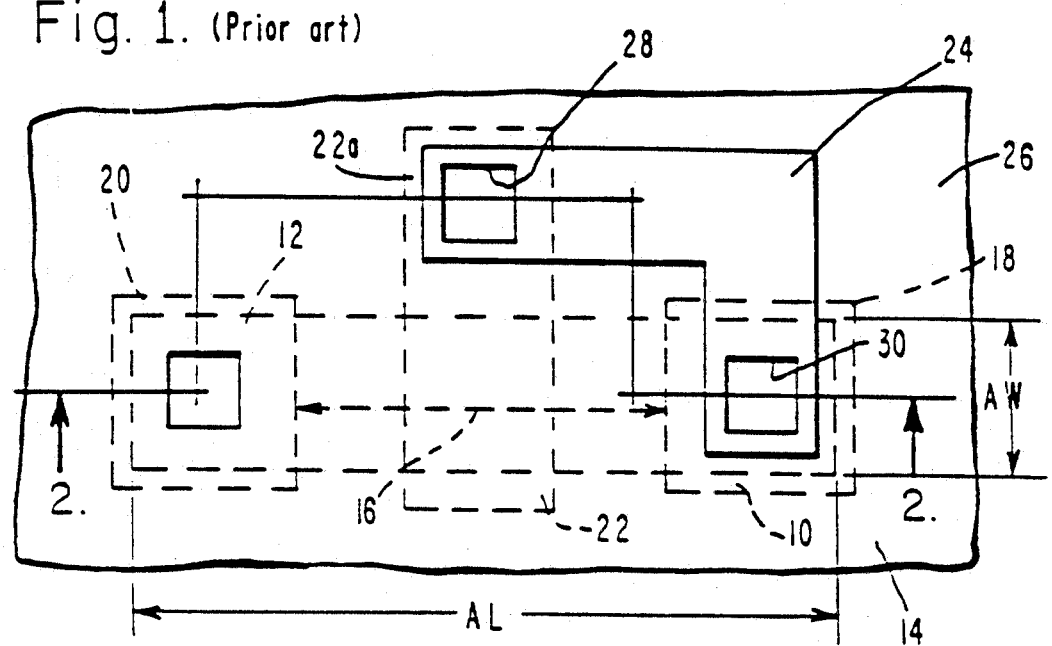
FIG. 1 is top plan view of a contact structure commonly employed in the prior art.
Figure 2:
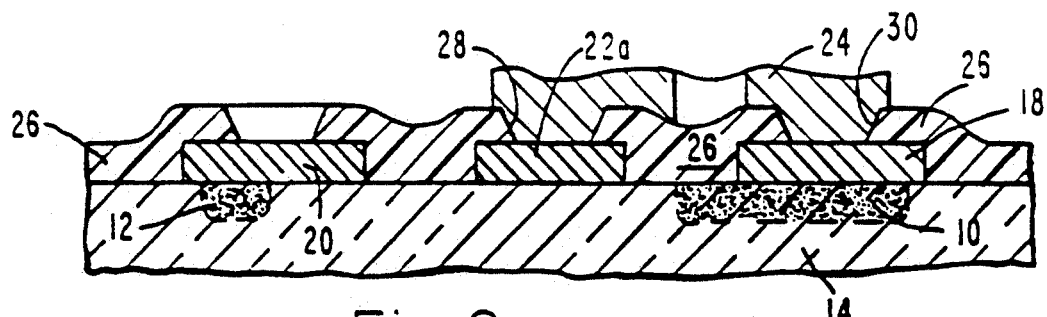
FIG. 2 is a cross-sectional view taken along the line 2—2 of FIG. 1.

Referring now to the drawings wherein like numerals of reference designate like elements throughout, a conventional shorting contact is shown in FIGS. 1 and 2. There, source and drain regions 10 and 12, respectively, are formed in a III-V substrate 14. A channel region 16 connects the source and drain regions 10, 12. As is well-known, the source, drain, and channel regions 10, 12, and 16, respectively, are of one conductivity type, formed in a larger region of either the opposite conductivity type or of semi-insulating material. The device active area consists of regions 10, 12, and 16, having width AW and length AL as shown in the drawings.

The source and drain regions 10, 12 are separately contacted by ohmic metal regions 18, 20, respectively. A gate electrode 22 forms a Schottky contact to the channel region 16 and is spaced apart from the source and drain ohmic metal regions 18, 20.

It is desired to short the source 10 or drain 12 to the gate electrode 22 for certain device applications. As shown in FIGS. 1 and 2, a separate interconnection metal layer 24 is used to interconnect the source ohmic metal region 18 and an extension 22a of the gate electrode 22. This is done by forming appropriate openings 28, 30 in the dielectric layer 26 and routing the interconnection metal layer 24 from the ohmic metal contact region 30 to the gate electrode contact region 28 on the gate electrode extension 22a. As can be clearly seen in FIG. 1, the routing of the interconnection metal layer 24 avoids the active region of the device.

Of course, the same approach is taken if the drain 12 or both the source and drain are shorted to the gate 22.

It will be seen from an examination of FIGS. 1 and 2 that the conventional approach requires considerable area to make the contact between the source 10 and gate 22, due to avoidance of the device active region. This avoidance is required to prevent possible problems of the contact opening degrading the channel region. Further, another level of interconnection metallization is required to form the connection, which means additional process steps to define and etch openings 28, 30 in the dielectric layer 26 before deposition of the interconnection metal 24.

Figure 3:
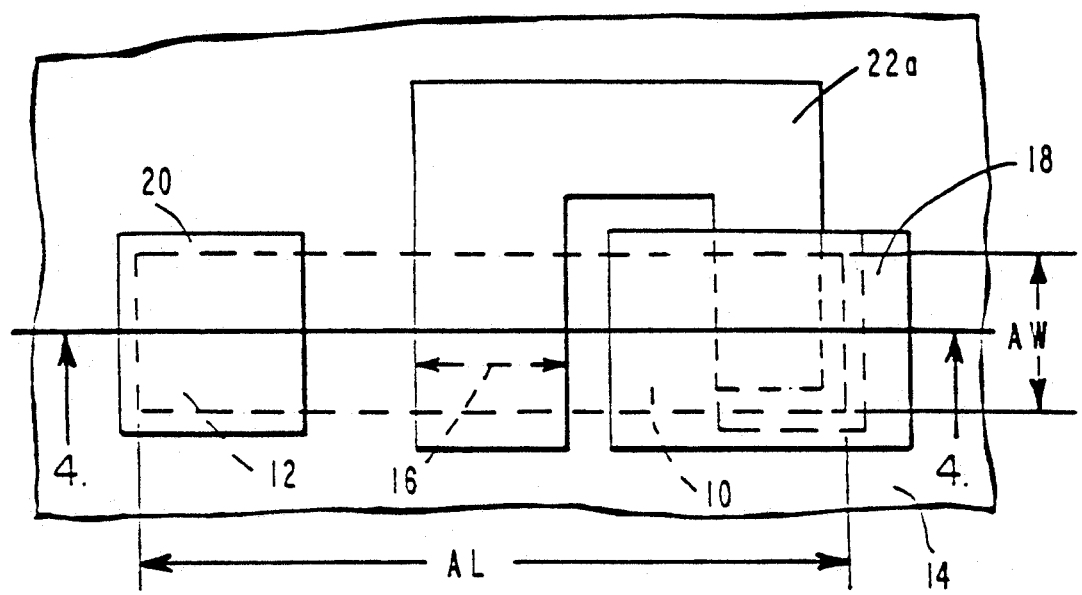
FIG. 3 is a top plan view of an improved contact structure employed in the prior art.
Figure 4:
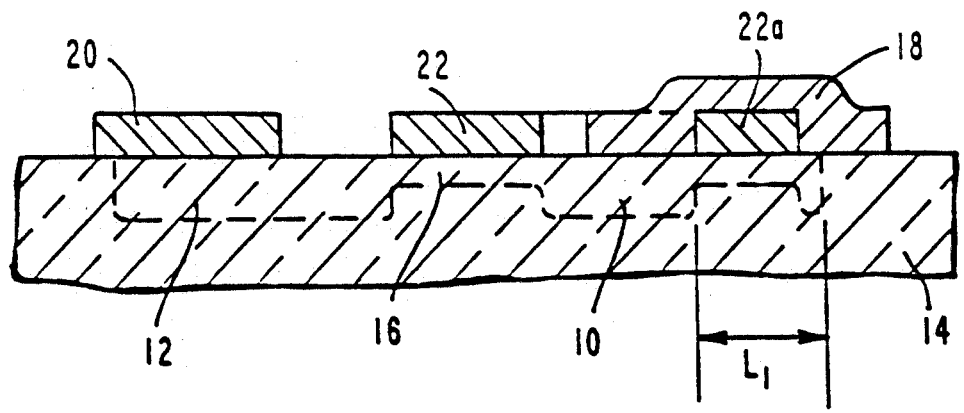
FIG. 4 is a cross-sectional view taken along the line 4—4 of FIG. 3.

FIGS. 3 and 4 illustrate an improved prior art shorting contact developed for use with a self-aligned refractory gate MESFET process. In this case, the source ohmic contact metal region 18 makes contact through extension 22a of the gate electrode 22. Although the requirement for the use of an additional layer of interconnection metal has been removed, little space is saved because the gate electrode extension 22a extends beyond the transistor area (device active region) in the width direction. Additionally, the transistor area is increased in length by the gate extension 22a. As shown in FIGS. 3 and 4, the source ohmic contact metal needs the same contact area as before. The length AL is increased by the length $L_1$ of 22a on the active area. In addition to the area disadvantage of this technique, yield and reliability become problems in more densely packed circuits because of the step coverage and liftoff disadvantages.

In accordance with the invention, the required connection may be made without using any additional area beyond that required to fabricate the transistor and without requiring another level of metallization. In the invention, a direct shorting contact is provided.

The direct shorting contact is a structure for making a direct metal connection between the gate 22 and source 10 (or drain 12, or both) of an FET. It is particularly advantageous for (but not limited to) MESFETs (metal-semiconductor FETS), where both a gate electrode 22 (to form the Schottky contact) and an ohmic metal 18', 20 (to form the ohmic contacts) are used.

Figure 5:
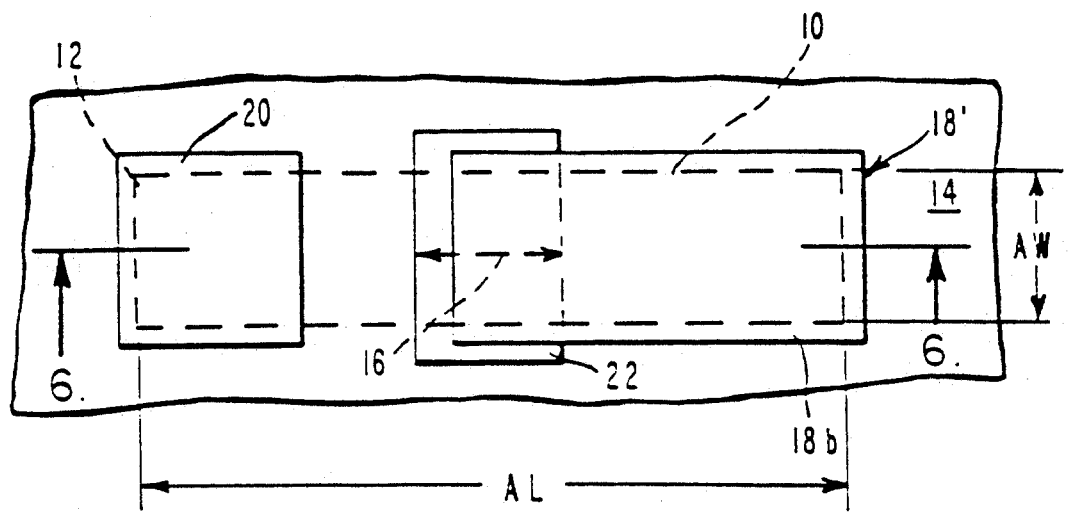
FIG. 5 is top plan view of a contact structure in accordance with the invention.
Figure 6:
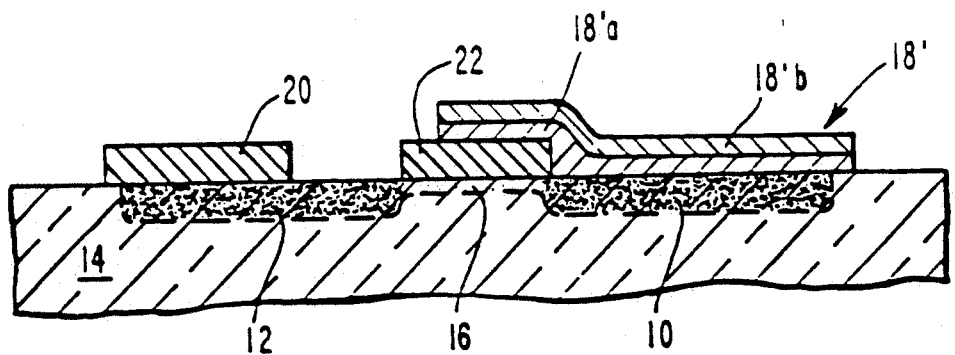
FIG. 6 is a cross-sectional view taken along the line 6—6 of FIG. 5.

As shown in FIGS. 5 and 6, a direct shorting contact is formed by allowing the ohmic metal 18' to overlap directly onto the gate electrode 22, on top of the device active area. The gate electrode 22 can be patterned either by etching or by liftoff, depending on the specific metallization and process requirements, and the ohmic metal 18' is patterned by liftoff.

With the appropriate ohmic metal, fabricating direct shorting contacts requires only a change in the FET layout and does not require any additional processing steps. Thus, direct shorting contacts substantially reduce layout area and improve circuit density by making more efficient use of gate metal and ohmic metal for interconnecting devices.

Process and Reliability considerations

There are potential problems with the direct shorting contact scheme of the invention that require the use of alternative contact metallizations. As is well-known, the typical prior art contact metallization comprises a first layer of gold-germanium alloy contacting the semiconductor substrate, followed by a second layer of nickel thereover, and a third, thick layer of gold.

However, the contact step at the gate edge may result in poor step coverage or poor reliability if an inappropriate metallization scheme is employed. Further, there can be a large current flow through the step, which can result in premature failure due to electromigration if there is poor step coverage.

These problems are obviated by use of the novel ohmic metal 18' described above, which comprises two layers: first layer 18'a of a suitable alloy to III-V semiconductors to provide ohmic contact thereto and second layer 18'b of a good electrically conductive, thermally stable, electromigration-resistant metal capable of providing good step coverage, to prevent device failures.

Prior to forming the ohmic contact of the invention, the wafer is processed up through a patterned gate metal, followed by source/drain region implant and activation. These steps are well-known in processing III-V semiconductor devices and, thus, do not in themselves form a part of this invention.

A layer of photoresist (not shown) is then deposited everywhere on the wafer, including over the patterned gate metal. The photoresist is developed conventionally to expose those gate electrodes and those source and/or drain regions between which direct contact is to be made.

Optionally, a dielectric layer (not shown) is deposited prior to depositing the photoresist layer. Those portions exposed following patterning of the photoresist layer are then etched to expose the gate electrodes and source/drain regions. This optional technique is the well-known "dielectric assisted" liftoff process, using silicon dioxide or silicon nitride. As is well-known, the thickness x of the dielectric ranges from about 0.5x to 2.0x. The dielectric is conveniently deposited by chemical vapor deposition (CVD), plasma-enhanced CVD or sputtering.

The exposed portions of the semiconductor surface is next conditioned to receive the first layer of the ohmic contact of the invention. Each metal alloy has its own particular, well-known processing. For example, some alloys require an acid clean of the III-V surface, others require an etch of the surface. The current state of the art is very diverse on this; there are several well-known procedures available to the person skilled in the art.

The ohmic sublayer 18'a is deposited first. The ohmic sub-layer 18'a is formed to a thickness of about 100 to 1,000Å. The thickness of this layer is chosen to be consistent with the thickness of the source and drain junctions to achieve the lowest contact resistance. This layer is formed by any of the processes known in the prior art.

Next, the second layer 18'b is deposited. Since Au-Ge is known to exhibit balling up and electromigration, the metal comprising this layer must be of a nature to prevent such behavior. Examples of suitable metals include tungsten, tungsten nitride ($WN_x$, where x ranges up to about 1.0) and tungsten silicide ($WSi_x$, where x ranges up to about 2), and other refractory metals, refractory metal silicides, and refractory metal nitrides. Examples of such other refractory metals include molybdenum and titanium. In addition, platinum, palladium and chromium may be suitably employed as the second layer 18'b, as well as their silicides and other well-known silicides.

The metal layers 18'a, 18'b are conveniently deposited by sputtering, with the nitrides or silicides formed in the presence of a nitrogen source or a silicon source, respectively. Evaporation may alternately be employed to deposit other materials. Advantageously, the two metal layers are deposited sequentially in situ, to avoid exposing the first layer to the ambient atmosphere.

The second layer 18'b is deposited to a thickness of about 500 to 1,700Å. The minimum thickness of the second layer 18'b is determined by allowable sheet resistance and step coverage concerns. The maximum thickness is determined by patterning capability. Thicker layers are more difficult to pattern by either etching or lift-off.

Finally, the photoresist layer is removed by conventional liftoff to remove excess metal, which is lying over the photoresist layer, leaving the (optional) dielectric layer behind.

INDUSTRIAL APPLICABILITY

The direct shorting contact scheme of the invention is expected to find use in III-V semiconductor devices, especially GaAs devices.

Thus, there has been provided a contact for shorting sources and/or drains to gates which saves complexity and layout space. A contact metallization scheme which provides good step coverage, good morphology, and good ohmic contact to GaAs has also been provided. Various changes and modifications of an obvious nature may be made without departing from the spirit and scope of the invention, and all such changes and modifications are deemed to fall within the scope of the invention as defined by the appended claims.

What is claimed is:

1. A method of forming a contact for shorting at least one of a source and drain region to a gate electrode in a III-V semiconductor device having an active region therebetween, said contact comprising an ohmic metal contact, said method comprising contacting at least one of said source and drain regions with a first portion of said contact and contacting said gate electrode with a second portion of said contact, said contact routed directly over said active region between said first portion and said second portion to provide a reduced area contact, said ohmic metal comprising a composite ohmic metal comprising (a) a first layer of a metal which makes ohmic contact to III-V semiconductor materials in contact with at least one of said source or said drain and with said gate electrode and (b) a second layer of an electrically conductive, thermally stable, electromigration-resistant metal capable of providing good step coverage formed over said first layer.

2. A process for forming a contact for shorting at least one of a source and drain region to a gate electrode in a III-V semiconductor device having an active region therebetween, said contact comprising an ohmic contact, said process comprising:
   (a) forming a patterned gate metal on a surface of a III-V semiconductor wafer;
   (b) forming source and drain regions by implantation and activation;
   (c) forming a photoresist layer over said surface and said gate metal;
   (d) patterning said photoresist layer to expose portions of said source regions, said drain regions, or said source and drain regions;
   (e) conditioning said semiconductor surface to receive a first layer of said ohmic contact, said first layer comprising a metal for making ohmic contact to III-V semiconductor materials;
   (f) depositing said first layer of said ohmic contact on said patterned photoresist layer;
   (g) depositing a second layer of metal on said first layer, said second layer comprising an electrically conductive, thermally stable, electromigration-resistant metal capable of providing good step coverage formed over said first layer; and
   (h) removing excess metal on said photoresist layer by liftoff.

3. The process of claim 2 wherein said first layer comprises a material selected from the group consisting of gold-germanium, nickel-germanium, gold-germanium-nickel, molybdenum-germanium, and aluminum-germanium.

4. The process of claim 3 wherein said first layer is formed to a thickness of about 100 to 1,000Å.

5. The process of claim 2 wherein said second layer comprises a metal selected from the group consisting of platinum, palladium, and chromium, a refractory metal selected from the group consisting of tungsten, molybdenum, and titanium, and the nitrides and silicides thereof.

6. The process of claim 5 wherein said second layer is formed to a thickness of about 500 to 1,700Å.

7. The process of claim 5 wherein said second layer comprises $WN_x$, where x ranges up to about 1.0.

8. The process of claim 5 wherein said second layer comprises $WSi_x$, where x ranges up to about 2.

9. The process of claim 2 wherein a dielectric layer is deposited prior to depositing said photoresist layer and is patterned by etching exposed portions following said patterning of said photoresist layer.

10. The process of claim 2 wherein both said first layer and said second layer are deposited sequentially in situ to avoid exposure of said first layer to the ambient atmosphere.

11. A method of forming a contact for shorting at least one of a source or drain region to a gate contact in a III-V semiconductor device, said contact comprising an ohmic metal contact, said method comprising (1) contacting at least one of said source and drain regions with a first portion of said contact and contacting said gate contact with a second portion of said contact, said contact routed directly between said first portion and said second portion to provide a reduce area contact and comprising a first layer of gold-germanium alloy, and (b) forming a second layer of an electrically conductive, thermally stable, electromigration-resistant metal on said first layer.

12. The method of claim 11 wherein said second layer comprises a metal selected from the group consisting of platinum, palladium, and chromium, a refractory metal selected from the group consisting of tungsten, molybdenum, and titanium, and the nitrides and silicides thereof.

13. A method of forming a contact for shorting at least one of a source or drain region to a gate contact in a III-V semiconductor device having an active region therebetween, said contact comprising an ohmic metal contact, said method comprising (a) contacting at least one of said source and drain regions with a first portion of said contact and contacting said gate electrode with a second portion of said contact, said contact routed directly over said active region between said first portion and said second portion to provide a reduced area contact and comprising a first layer of gold-germanium alloy, and (b) forming a second layer of an electrically conductive, thermally stable, electromigration-resistant metal on said first layer.

14. The method of claim 13 wherein said second layer comprises a metal selected from the group consisting of platinum, palladium, and chromium, a refractory metal selected from the group consisting of tungsten, molybdenum, and titanium, and the nitrides and silicides thereof.

* * * * *